United States Patent [19]

Nakamura et al.

[11] Patent Number: 5,672,569

[45] Date of Patent: *Sep. 30, 1997

[54] PROCESS FOR FABRICATING A SUPERCONDUCTING CIRCUIT

[75] Inventors: Takao Nakamura; Hiroshi Inada; Michitomo Iiyama, all of Osaka, Japan

[73] Assignee: Sumitomo Electric Industries, Ltd., Japan

[*] Notice: The term of this patent shall not extend beyond the expiration date of Pat. No. 5,646,096.

[21] Appl. No.: 400,813

[22] Filed: Mar. 8, 1995

Related U.S. Application Data

[62] Division of Ser. No. 330,830, Oct. 27, 1994, abandoned, which is a continuation of Ser. No. 106,798, Aug. 16, 1993, abandoned, which is a continuation of Ser. No. 783,697, Oct. 30, 1991, abandoned.

[30] Foreign Application Priority Data

Oct. 31, 1990 [JP] Japan ................... 2-294294
Oct. 31, 1990 [JP] Japan ................... 2-294295

[51] Int. Cl.⁶ ................................................. H01L 39/24
[52] U.S. Cl. ................... 505/330; 505/410; 505/430; 505/220; 505/230; 505/234; 505/703; 427/62; 427/63
[58] Field of Search ............................ 505/330, 329, 505/410, 430, 191, 220, 703, 234, 230; 257/663, 662; 427/62, 63

[56] References Cited

U.S. PATENT DOCUMENTS

| | | |
|---|---|---|
| 5,001,108 | 3/1991 | Taguchi . |
| 5,075,200 | 12/1991 | Sugihara et al. . |
| 5,079,216 | 1/1992 | Henty . |
| 5,096,882 | 3/1992 | Kato et al. ................ 505/1 |
| 5,183,800 | 2/1993 | Nakagawa . |
| 5,194,419 | 3/1993 | Shiga et al. . |
| 5,236,896 | 8/1993 | Nakamura et al. . |

FOREIGN PATENT DOCUMENTS

| | | |
|---|---|---|
| 0 299 163 | 1/1989 | European Pat. Off. . |
| 0 302 354 | 2/1989 | European Pat. Off. . |
| 0 342 039 | 11/1989 | European Pat. Off. . |
| 0358879A2 | 3/1990 | European Pat. Off. . |
| 1-11349 | 1/1989 | Japan . |
| 64-35971 | 2/1989 | Japan . |
| 64-41242 | 2/1989 | Japan . |
| 64-69064 | 3/1989 | Japan . |
| 2-23674 | 1/1990 | Japan . |

OTHER PUBLICATIONS

Yoshida et al, "Monolithic Device Fabrication Using High–Tc Superconductor", International Electron Devices Meeting (San Francisco, CA) Dec. 11–14, 1988, pp. 282–285.

Felner et al, Solid State Communications, vol. 66, No. 2, 1988, pp. 205–210.

Linker et al., "Control of Growth Direction of Epitaxial YBaCuO Thin Films on SrTiO3 Substrates", Solid State Communications, vol. 69, #3, 1989, pp. 249–253.

(List continued on next page.)

*Primary Examiner*—Roy V. King
*Attorney, Agent, or Firm*—Beveridge, DeGrandi, Weilacher & Young, LLP

[57] ABSTRACT

A superconducting circuit having patterned superconducting wiring lines. Each wiring line consists of at least one portion (2') of the thin film (2) of an oxide superconductor deposited on a substrate (1). The portion (2') has a predetermined crystal orientation and the remaining portions (2") have a different crystal orientation or changed to non-superconductor. The superconducting circuit has a planar surface.

In variations, two different wiring lines (21, 22) each having a different crystal orientation are produced at different portions of a thin film of oxide superconductor, so that superconducting current flow separately through two different portions in a common thin film.

4 Claims, 7 Drawing Sheets

OTHER PUBLICATIONS

J.P. Rice et al., "Oxygenation and Deoxygenation Methods for Producing Sharp 90 K and 60 K Superconducting Transitions in Single Crystal $YBa_2Cu_3O_{6+x}$", *Journal of Low Temperature Physics*, vol. 77, Nos. 1/2, Oct., 1989, pp. 119–132.

R.C. Dye et al., "Laser Writing of Superconducting Patterns on $YBa_2Cu_3O_x$", *Applied Physics Letters*, vol. 57, No. 11, Sep. 10, 1990, pp. 1149–1151.

PROCESS FOR FABRICATING A SUPERCONDUCTING CIRCUIT

This application is a division of application Ser. No. 08/330,830, filed Oct. 27, 1994 now abandoned, which the U.S. Patent and Trademark Office held to be a continuation of application Ser. No. 08/106,798, filed Aug. 16, 1993 now abandoned, which is a continuation of application Ser. No. 07/783,697, filed Oct. 30, 1991 now abandoned, which applications are entirely incorporated herein by reference.

BACKGROUND OF THE INVENTION

1. Field of the Invention

The present invention relates to a novel superconducting circuit, more particularly, to a novel structure of a patterned superconducting wiring lines each made of a thin film of oxide superconductor deposited on a substrate and a process for fabricating the same.

2. Description of the Related Arts

The conventional superconductors exhibit the superconductive phenomenon only at extremely low temperatures, so that it has not been expected to be used in actual applications. In 1986, however, new oxide type superconductors of $[La, Ba]_2CuO_4$ and $[La, Sr]_2CuO_4$ were discovered and after then, discovery of the other superconducting compound oxides such as Y—Ba—Cu—O system or Bi—Ca—Sr—Cu—O system was continued. In these newly discovered oxide superconductors, the superconductive phenomenon can be realized with relatively cheaper liquid nitrogen and hence the possibility of an actual utilization of the high Tc superconductors has burst onto the scene.

Although these oxide superconductors were obtained initially in a bulk form of sintered block by powder sintering technique, now it becomes possible to prepare their thin films of high quality by physical vapour deposition or chemical vapour deposition techniques. The thin films of oxide superconductor are expected to be used in a variety of applications including sensors, SQUID, superconducting devices such as superconducting transistors or the like. In this specification, the term "oxide superconductor" means any high-Tc compound oxide which shows the critical temperature of above 30 K.

In superconducting circuits having superconducting wiring lines, it is desirable to integrate the superconducting patterned wiring lines in the same thin film of oxide superconductor that is used to fabricate the superconducting elements or devices. However, how to fabricate the patterned superconducting wiring lines in an integrated circuit have not been established.

It is known that the value of superconducting current depends on the orientation of crystals of which a thin film of oxide superconductor is made and that the crystal possesses anisotropy. This anisotropy limits the structure of a superconducting circuit including superconducting wiring lines made of a thin film of oxide superconductor.

An object of the present invention is to solve the problem and provide a novel structure of a superconducting circuit having patterned superconducting wiring lines each made of a thin film of oxide superconductor deposited on a substrate and a process for fabricating the same, so as to increase the freedom of circuit designing and to make the best use of oxide superconductor.

SUMMARY OF THE INVENTION

The present invention provides a superconducting circuit having patterned superconducting wiring lines each made of a thin film of oxide superconductors deposited on a substrate, characterized in that each of the superconducting wiring lines consists of at least one portion of a thin film of an oxide superconductor deposited on a flat substrate, each portion having a predetermined crystal orientation with respect to a surface of the substrate, remaining portions of the thin film of the oxide superconductor having a different crystal orientation from the portion, and all of the portion and the remaining portions make a continuous planar surface.

The terms "a-axis", "b-axis" and "c-axis" are crystal axes of a crystal, as are usually used in the crystallography and they are known and determined in crystalline oxide superconductors to which the present invention is applicable.

Orientation of these axes is usually defined by the direction of the crystal axis with respect to a surface of the substrate. For example, "a-axis oriented thin film" is a thin film whose a-axis is perpendicular to the surface of substrate.

The superconducting circuit having superconducting wiring lines according to the present invention can be fabricated from any oxide superconductor including compound oxide superconductors such as Y—Ba—Cu—O system, Bi—Sr—Ca—Cu—O system and Tl—Ba—Ca—Cu—O system.

The substrate on which the thin film of oxide superconductor is deposited is preferably a single crystalline substrate of oxide such as MgO, $SrTiO_3$, $CdNdAlO_4$ or the like. The substrate may be a semiconductor substrate such as silicon substrate having or not having an insulator layer or buffer layer.

The portion can be made of a thin film of the oxide superconductor whose a-axis is oriented perpendicular to the surface of the substrate. When the superconducting circuit is used in a multi-layered structure, another upper thin film of oxide superconductor is further deposited on a surface of the planar surface through an insulation layer which can have a thickness of less than 10 nm. The thin film of oxide superconductor can have viaholes connecting vertically adjacent superconducting layers.

The present invention provides a process for fabricating the superconducting circuit. The process is characterized by the steps of depositing a thin film of an oxide superconductor whole over a surface of the substrate in such a condition that the a-axis of crystals of the thin film orients perpendicularly to the surface of the substrate, forming an oxygen barrier layer through which oxygen can't pass in a desired pattern on a surface of the thin film, subjecting thin film having oxygen barrier layer thereon to deoxygenation treatment to such an extent that exposed portions of thin film change to no superconductor, and removing the oxygen barrier layer from a surface of thin film to obtain a planar surface having patterned wiring lines at unexposed portions.

The deoxygenation treatment can be carried out in a ultra-high vacuum chamber while the substrate is heated. The oxygen barrier layer can be made of ceramic such as MgO and SiN or metal such as Au.

An essence of the process according to the present invention resides in that a thin film of oxide superconductor deposited whole over a surface of a substrate is exposed to deoxygenation treatment after the thin film of oxide superconductor is protected at predetermined areas by a patterned oxygen barrier layer.

In the conventional process for fabricating patterned wiring lines on a thin film of oxide superconductor, the thin film of oxide superconductor itself is directly machined by etching technique, so that the resulting superconducting patterned wiring lines doesn't have a planar surface. Still more, it is difficult to flatten a surface of the resulting superconducting patterned wiring lines.

In the process according to the present invention, a patterned oxygen barrier layer is firstly formed on a surface of a thin film of oxide superconductor deposited on a surface of a substrate, and then deoxygenation treatment is effected on the thin film of oxide superconductor so as to produce a patterned superconducting wiring lines at the patterned area protected by the oxygen barrier layer. Since the patterned wiring lines according to the present invention are not subjected to physical machining, the resulting patterned wiring lines maintain a flat surface of the thin film as deposited, resulting in facilitating operations which will be effected in next stage for depositing another layer and/or for fabricating the other circuit elements on the resulting superconducting patterned wiring lines.

The present inventors found such a fact that the diffusion velocity of oxygen depend on the crystal orientation of the thin film. In fact, oxygen escape slowly out of a c-axis oriented thin film of oxide superconductor, while the diffusion velocity of oxygen out of an a-axis oriented thin film of oxide superconductor is very rapid.

Therefore, the a-axis oriented thin film of oxide superconductor is advantageously used in the process according to the present invention in order to accelerate the deoxygenation treatment and to realize fine patterning.

The portions above-mentioned can be divided into two groups of thin films of a-axis (or b-axis) oriented thin film and c-axis oriented thin film. It should be noted that them is no difference from the view point of flowability of superconducting current between the a-axis oriented thin film and the b-axis oriented thin film in the oxide superconductors to which the present invention is applicable, because the oxide superconductors have layered structures in which the superconducting current flow dominantly to the direction which is perpendicular to the c-axis.

In a variation of the present invention, the superconducting circuit is characterized in that the superconducting wiring lines consist of first superconducting wiring lines and second superconducting wiring lines, all of the superconducting wiring lines being made of an identical oxide superconductor, each of first superconducting wiring lines is made of a thin film of oxide superconductor whose c-axis is perpendicular to a surface of the substrate so that a superconducting current flows in parallel with the surface of the substrate, each of second superconducting wiring lines is made of a thin film of oxide superconductor whose a-axis is perpendicular to the surface of the substrate so that a superconducting current flows vertically with respect to surface of the substrate, and the superconducting circuit has a planar surface.

In this case also, the superconducting circuit can have insulation zones, viaholes, another upper thin film of oxide superconductor deposited on the planar surface through an insulation layer which can have a thickness of less than 10 nm.

This superconducting circuit can be produced by the steps of depositing a first thin film of an oxide superconductor whose a-axis or c-axis is oriented perpendicularly to a surface of substrate, removing predetermined areas of the first thin film to leave patterned first superconducting wiring lines, depositing a second thin film of the same oxide superconductor as the first thin film in such a condition that the second thin film becomes a c-axis oriented thin film or a-axis oriented thin film but has a different orientation from the first thin film on a whole surface of the substrate having the patterned first thin film, and removing an upper part of the second thin film so as to expose the patterned first thin film up to a planar level.

In this case, the first thin film of oxide superconductor is preferably a c-axis oriented thin film and the second thin film of oxide superconductor is preferably an a-axis oriented thin film.

In this type superconducting circuit, all superconducting wiring lines made of an identical oxide superconductor make a planar surface in a single layer but each superconducting wiring line has a different crystal orientation.

As stated above, the thin film of oxide superconductor shows anisotropy in the current property due to the anisotropy in crystal. In fact, the superconducting current flows dominantly along a direction which is perpendicular to the c-axis but almost zero current flow along a direction of the c-axis.

The superconducting circuit according to the present invention has such a novel structure that both of the a-axis oriented thin film and the c-axis oriented thin film are juxtaposed in a layer and two superconducting wiring lines make a planar surface. However, substantially no current flow between these two superconducting lines even if these two thin films of a-axis oriented thin film and c-axis oriented thin film are juxtaposed because no substantial current is propagated between these two thin films.

This novel structure of superconducting circuit permits to realize the mostly compacted wiring design due to such a fact that both of superconducting lines made of the a-axis oriented thin film and of the c-axis oriented thin film can be juxtaposed closely on a common surface of a substrate in the mostly compacted condition which could not be done in the case of metal conductors.

The superconducting wiring lines made of a-axis oriented thin film are used to pass an electric current along a direction which is perpendicularly to the surface of the substrate, in other words, they function as conductor lines connecting two adjacent layers deposited one over another, while the superconducting wiring lines made of c-axis oriented thin film are used to pass an electric current along a direction which is in parallel with the surface of the substrate.

The superconducting circuit according to the present invention can be used for fabricating a multi-layered superconducting circuit. In this case also, superconducting wiring lines as well as viaholes can be arranged in a juxtaposition in each layer at the mostly compacted layout and can be contacted by vertical wiring lines filled in the viaholes.

In practice, the superconducting circuit can be fabricated as following:

At first, a first thin film of an oxide superconductor whose a-axis or c-axis is oriented perpendicularly to a surface of the substrate. Then, predetermined areas of the first thin film of oxide superconductor are removed to leave a patterned first superconducting lines. After then, a second thin film of the same oxide superconductor is deposited in such a condition that the second thin film becomes a different orientation from the first thin film thereon. Namely, when the first thin film is an a-axis oriented thin film, a c-axis oriented thin film is deposited and when the first thin film is a c-axis oriented thin film, an a-axis oriented thin film is deposited. It is preferable to prepare firstly the c-axis oriented thin film in consideration of such a fact that a higher substrate temperature is required to prepare the c-axis oriented thin film.

The deoxygenation is effected on such portions of the superconducting lines that will not be used as wiring lines.

The deoxygenation can be done to the second thin film so as to produce a finally patterned superconducting circuit.

The process has following merits:
(1) The thin film of oxide superconductor is not deteriorated by heat-treatment during the process because both of the a-axis oriented thin film and the c-axis oriented thin film are made of an identical material.
(2) Fabrication of the other elements and/or wiring lines which will be effected on a surface of the superconducting circuit obtained by the present invention become easy because the patterned superconducting circuit has a flat surface.

In summary, the superconducting patterned wiring lines prepared by the present invention have a planar surface which facilitates fabrication of a superconducting devices and also possess high mechanical resistance, because all portions of thin film are connected to each other through the non-superconductor which is made of the same material as the superconducting lines. Still more, two different superconducting lines for passing superconducting current in parallel with a surface of a substrate and for passing superconducting current perpendicularly to the surface of the substrate can be arranged in juxtapositions in a layer. Still more, deterioration of superconducting properties of thin films of oxide superconductor caused by heat-treatment can be prevented, because all of superconducting lines each having a different function and the insulator zones can be produced by an identical material.

Now, the present invention will be described with reference to Examples but the scope of the invention should not be limited thereto.

BRIEF DESCRIPTION OF THE DRAWINGS

FIGS. 2A, 2B, 2C, 2D, 2E, 2F-1, 2F-2, 2G and 2H illustrate successive steps for fabricating the patterned superconducting wiring lines shown in FIG. 1.

DESCRIPTION OF THE PREFERRED EMBODIMENTS

Example 1

Figure 1:
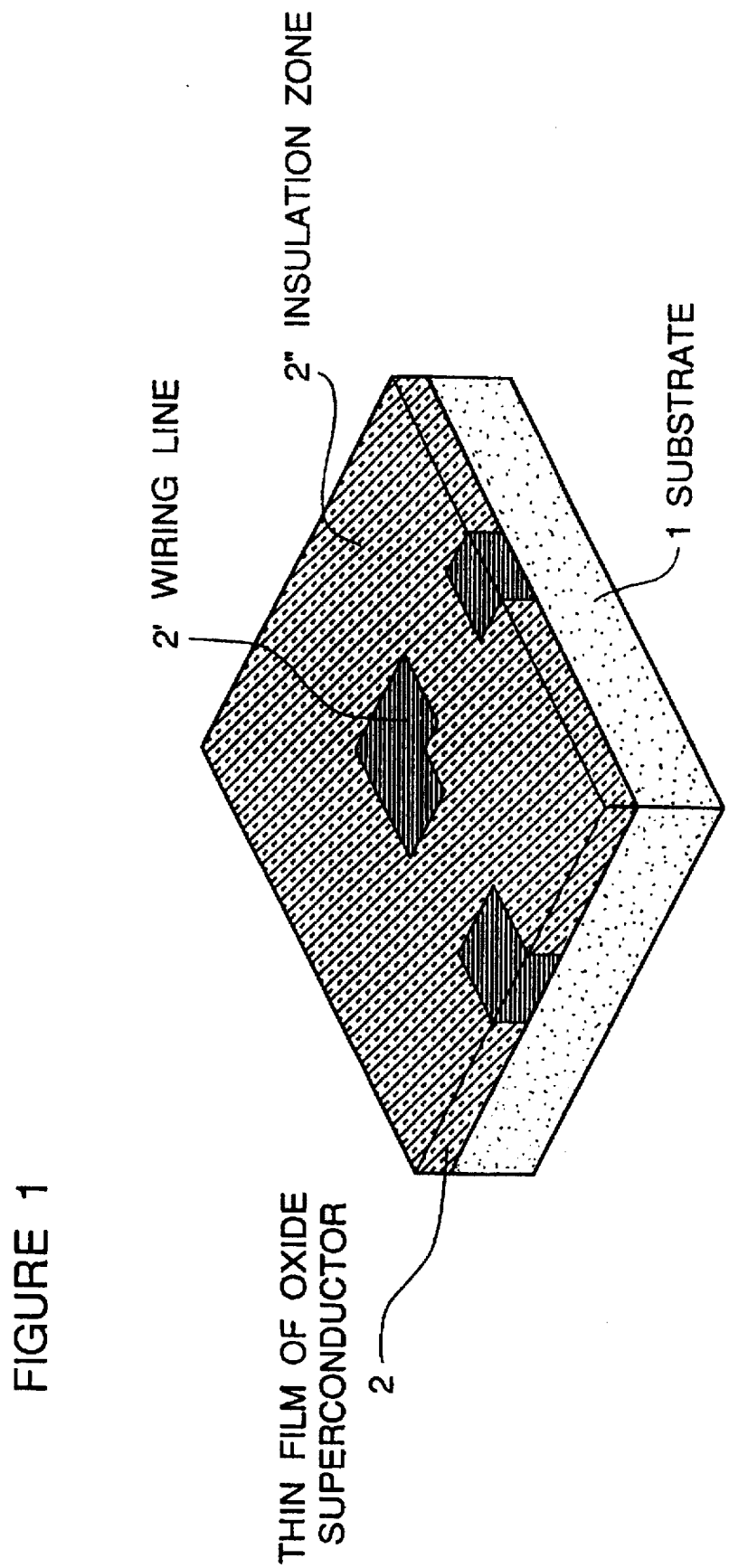
FIG. 1 is an illustrative perspective view of patterned superconducting wiring lines provided by the first aspect of the present invention.

FIG. 1 is an illustrative perspective view of superconducting wiring lines provided by the first aspect of the present invention.

The superconducting wiring line 2' consists of at least a portion of a crystalline thin film 2 made of oxide superconductor deposited on a substrate 1. The superconducting wiring line 2' is made of a portion of the thin film 2 whose an a-axis is oriented perpendicularly to a surface of said substrate 1. The superconducting wiring line 2' is surrounded by insulation zones 2" consisting of the remaining portions of the crystalline thin film 2 in which oxygen is removed out of the crystals and hence they are changed to non-superconductor.

Example 2

Figure FIGS. 2A to 2H illustrate successive steps for fabricating the superconducting wiring pattern shown in FIG. 1.

Figure 2A:
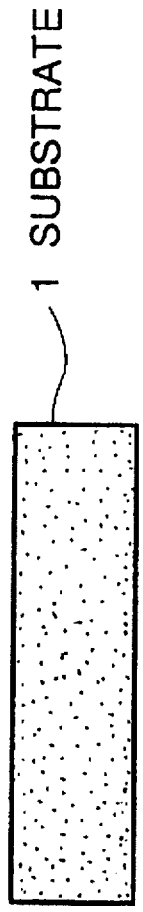

In this example, at first, a substrate 1 having a smooth surface is prepared (FIG. 2A). The substrate can be MgO (100) single crystal. Other substrate such as $CdNdAlO_4$ substrate or a silicon substrate having a buffer layer can be used in place of the MgO single crystal.

Figure 2B:
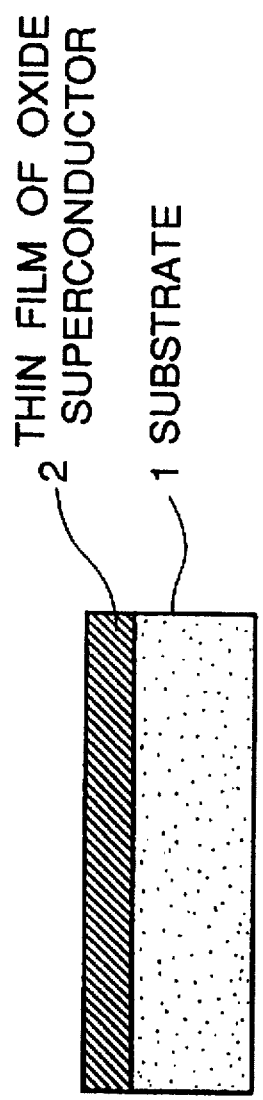

Then, on the substrate 1, a thin film 2 of oxide superconductor having a thickness of more than 200 nm is deposited (FIG. 2B). This thin film 2 can be prepared by any technique including off-axis sputtering, reactive evaporation or the like. In this Example, the thin film 2 of oxide superconductor is prepared by the off-axis sputtering technique under the presence of a mixed sputtering gas of $Ar+O_2$ (volume ratio of 9:1) of 10 Pa. The substrate is heated at a temperature which is not higher than 650° C. so that the thin film of oxide superconductor deposited becomes an a-axis orientated thin film.

Figure 2C:
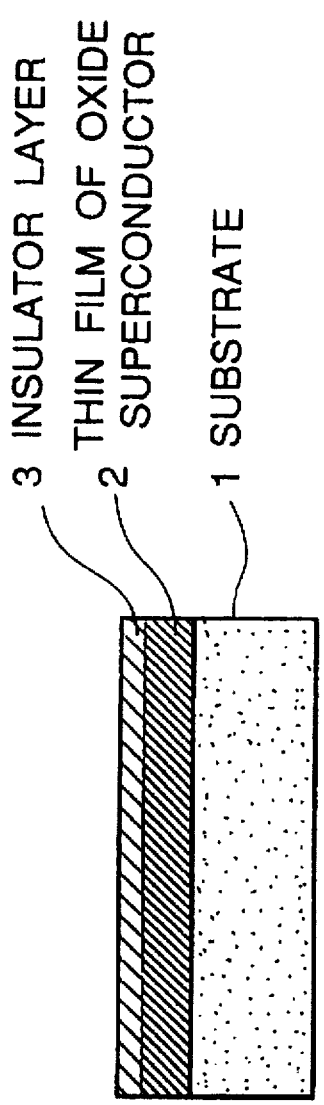

Then, as is shown in FIG. 2C, an insulation layer or oxygen barrier layer 3 is deposited. The oxygen barrier layer 3 may be made of MgO, SiN, Au or the like.

Figure 2D:
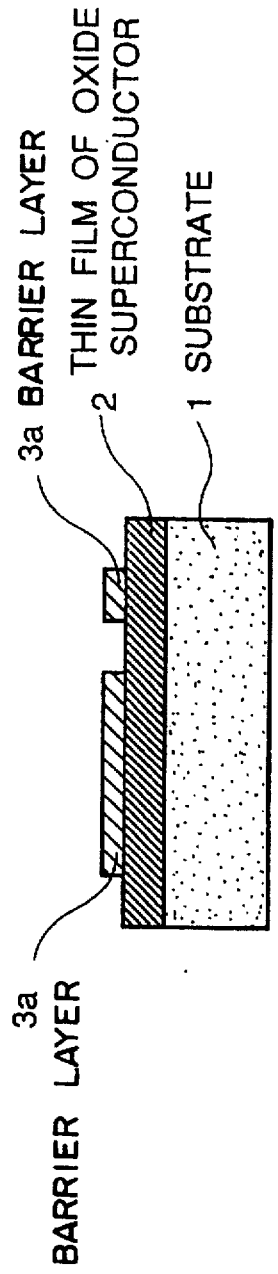

Then, the oxygen barrier layer 3 is patterned by known photolithograph technique as is shown in FIG. 2D. A pattern formed in the barrier layer 3 corresponds to the final superconducting wiring pattern. In other words, the resulting patterned barrier layer 3a has the same pattern as the superconducting wiring pattern.

Figure 2E:
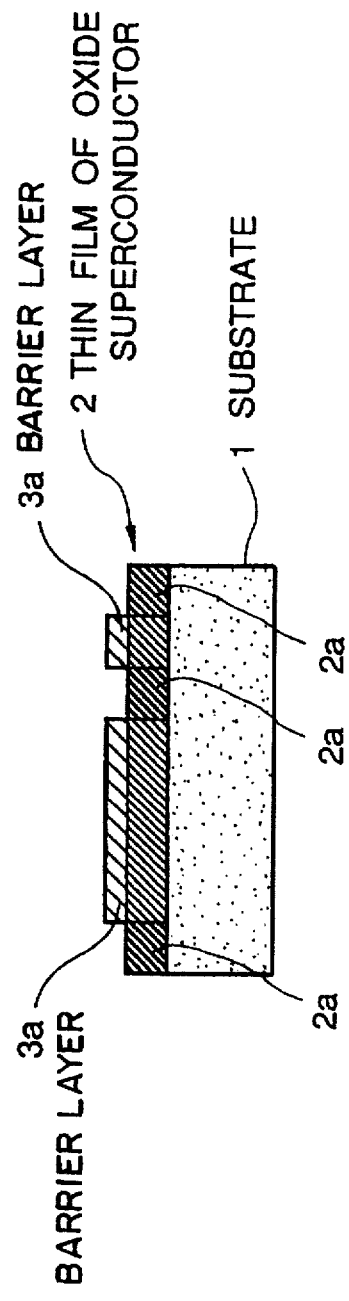

The thin film of oxide superconductor 2 having the resulting patterned barrier layer 3a thereon is subjected to deoxygenation treatment as is shown in FIG. 2E. In this example, the deoxygenation is effected by maintaining the substrate having the thin film of oxide superconductor 2 and the patterned barrier layer 3a thereon in a ultra-high vacuum chamber for one hour while the substrate is heated at a temperature which is not higher than 400° C. During this deoxygenation treatment, oxygen escape out of the thin film at the areas which are not covered with the barrier layer 3a to produce insulating zones or non-superconductor zone 2a in the thin film 2 while the areas covered with the barrier layer 3a are protected from the deoxygenation treatment to leave a patterned superconducting wiring lines.

The resulting thin film having the patterned superconducting wiring lines can be utilized as they are as a superconducting circuit having conductor lines. In this case, an outer protective layer 4 is preferably formed on a surface of the thin film 2 of oxide superconductor as is shown in FIG. 2F-1.

Figures 1, 2F:
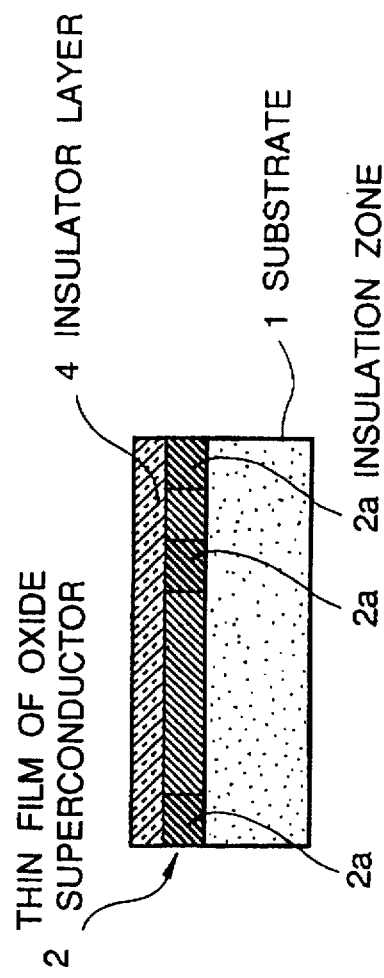
Figures 2, 2F:
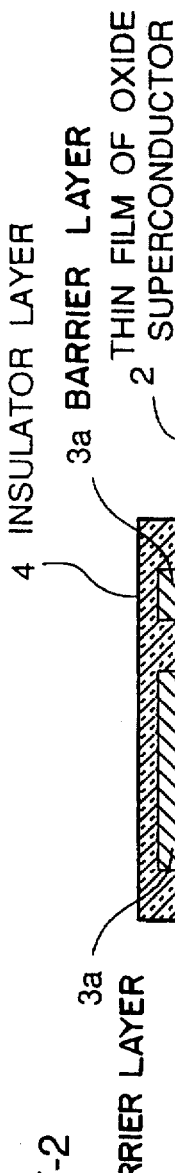
Figure 2G:
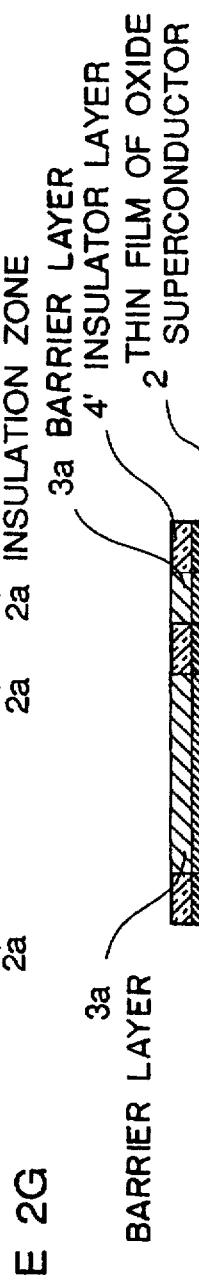
Figure 2H:
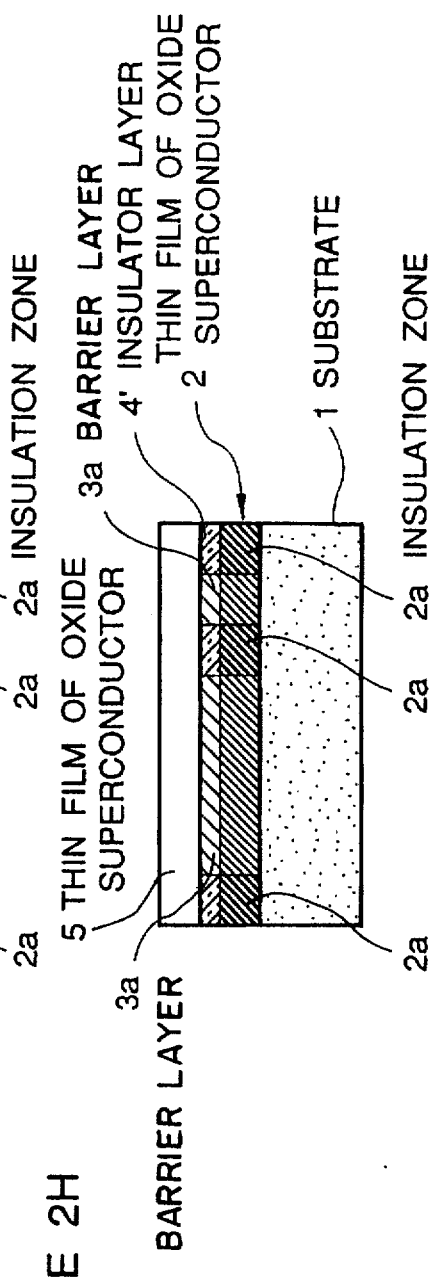

In a variation for fabricating a multi-layered superconducting circuit having layered thin films of oxide superconductor, another upper thin film layer of oxide superconductor is prepared by the steps shown in FIGS. 2F-2 to 2H as following:

In this case, after the step of FIG. 2E, a protective layer 4 is deposited whole over the surface of the thin film 2 having the oxygen barrier layer 3a as is shown in FIG. 2F-2.

Then, the two layers of the protective layer 4 and the barrier layer 3a are etched back to leave a flat thin film layer 4' consisting of the protective layer 4 and the barrier layer 3a as is shown in FIG. 2G. When the flat thin film layer 4' is used as an interlayer barrier in a tunnel type superconducting device utilizing the proximity effect, a thickness of the flat thin film layer 4' must be reduced as thin as possible. This etching can be carried out by a reactive ion etching technique or ion milling technique.

Finally, on a surface of the flat thin film layer 4', another thin film 5 (FIG. 2H) of oxide superconductor in which an upper wiring pattern or a suitable superconducting element or device is fabricated is deposited.

The flat thin film layer 4' can be used as an insulator layer which separates adjacent two thin films layers 2 and 5 of oxide superconductor or can be used an interlayer barrier which functions as a weak junction in a superconducting device utilizing the proximity effect. In the latter case, the thickness of the barrier layer 3a remained in the flat thin film layer 4' must be as thin as possible. When the barrier layer 3a is made of an insulator, the thickness of the barrier layer 3a remaining is preferably reduced to less than 10 nm so that a tunnel effect is realized by the barrier layer 3a.

Example 3

Figure 3:
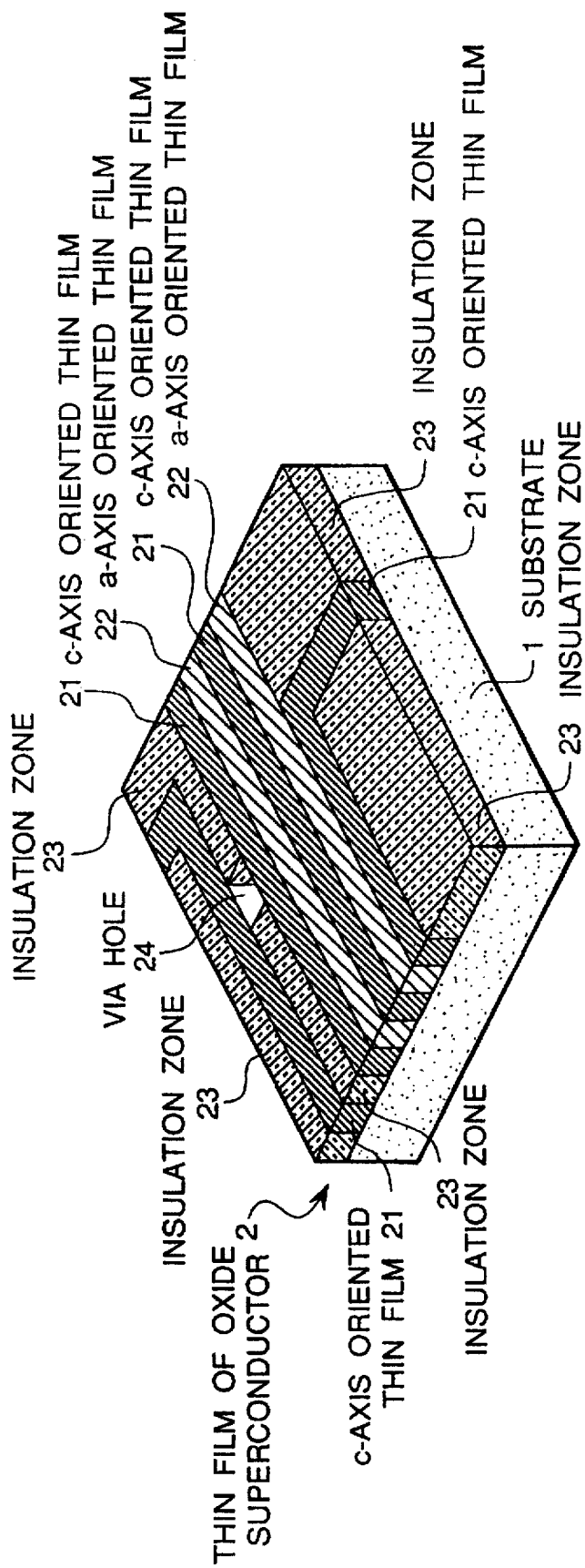
FIG. 3 is an illustrative perspective view of a superconducting circuit having patterned wiring lines provided by the second aspect of the present invention.

FIG. 3 is an illustrative perspective view of a superconducting circuit provided by the second aspect of the present invention.

The superconducting circuit of FIG. 3 has a thin film layer 2 of oxide superconductor deposited on a substrate 1. The thin film layer 2 of oxide superconductor comprises c-axis oriented thin film zones 21, a-axis oriented thin film zones 22, insulation zones 23 in which superconductivity is lost and viaholes 24.

The c-axis oriented thin film zones 21 provide superconducting lines in which superconducting current is propagated in parallel with a surface of the substrate 1. The a-axis oriented thin film zones 22 provide superconducting lines in which superconducting current flow perpendicularly to the surface of the substrate 1. No superconducting current flow in the insulation zones 23. The viaholes 24 are used to connect layers in a stacked multi-layered circuit (not shown).

Example 4

FIGS. 4A to 4F illustrate successive steps for fabricating the superconducting circuit shown in FIG. 3. The oxide superconductor used in this Example 4 is a compound oxide superconductor of Y—Ba—Cu—O system.

Figure 4A:
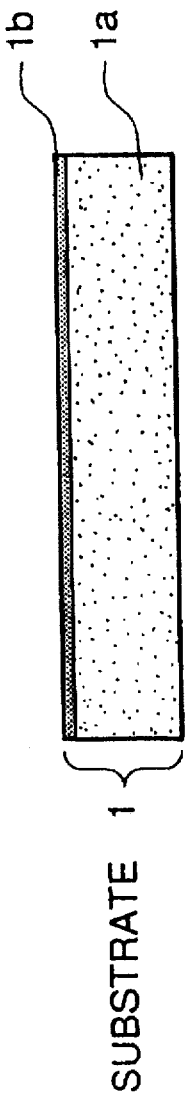
FIGS. 4A, 4B, 4C, 4D, 4E and 4F illustrate successive steps for fabricating the superconducting circuit shown in FIG. 3.
Figure 4B:
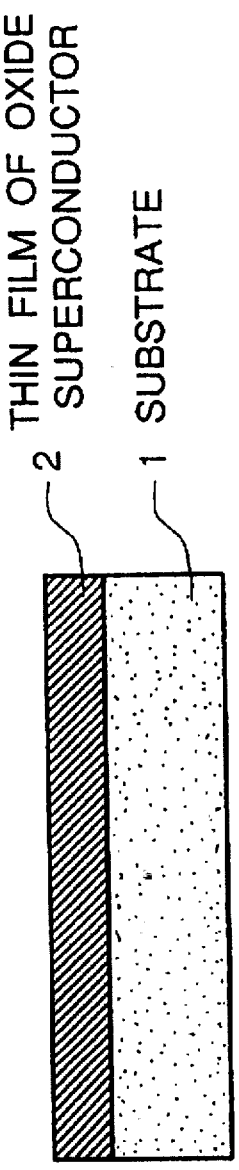

At first, a substrate 1 having a smooth surface is prepared. In this Example 4, the substrate 1 consists of a silicon base substrate 1a having a buffer layer 1b which is composed of an under-layer of $MgAl_2O_3$ having a thickness of 350 nm deposited by chemical vapour deposition (CVD) technique and an upper-layer of $BaTiO_3$ having a thickness of 75 nm deposited by sputtering technique. MgO (100) substrate, $CdNdAlO_4$ substrate or the like can be preferably used in place of the silicon substrate. On the buffer layer 1b of the substrate 1, a thin film 2 of oxide superconductor having a thickness of more than 200 nm as is shown in FIG. 4B is deposited. This thin film 2 can be prepared by an off-axis sputtering technique, a reactive evaporation technique the like. In this Example 4, the thin film 2 of oxide superconductor is prepared by the off-axis sputtering technique under the presence of a mixed sputtering gas of $Ar+O_2$ (volume ratio of 9:1) of 10 Pa. The substrate is heated at a temperature above 700° C. so that the thin film of oxide superconductor deposited shows c-axis orientation.

Figure 4C:
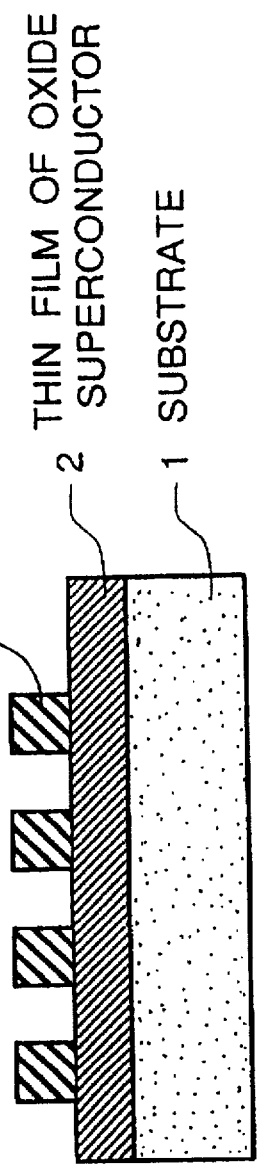

Then, as is shown in FIG. 4C, a photoresist layer 3 having a predetermined pattern is coated on the thin film 2 of oxide superconductor obtained by a well-known technique.

Figure 4D:
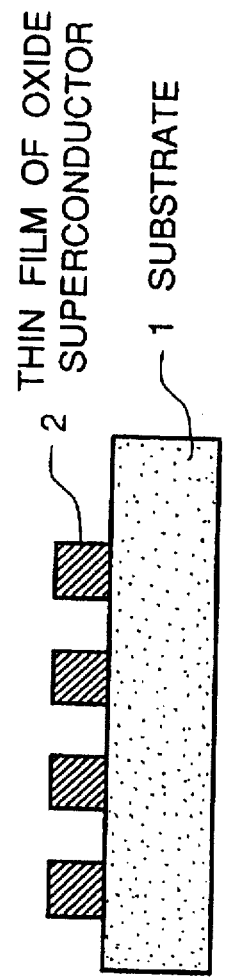

After the photoresist layer 3 is cured, exposed areas which are not covered with the photoresist 3 are removed by a dry etching technique such as reactive ion etching and argon milling or by a wet etching technique such as treatment with phosphoric acid or hydrochloric acid, so as to produce a patterned superconducting lines 2c consisting of the c-axis oriented thin film as is shown in FIG. 4D.

Figure 4E:
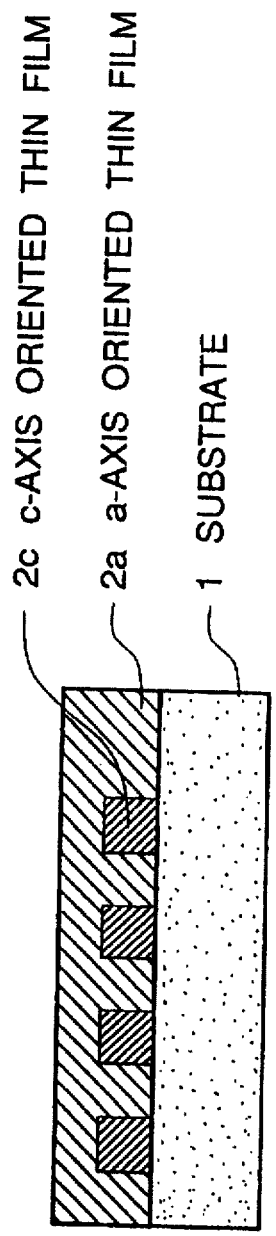

Then, as is shown in FIG. 4E, an a-axis oriented thin film 2a of the same oxide superconductor is deposited on the surface of the substrate 1 having the patterned superconducting lines 2c consisting of the c-axis oriented thin film. This thin film 2a of oxide superconductor also is prepared by the off-axis sputtering technique under the presence of a mixed sputtering gas of $Ar+O_2$ (volume ratio of 9:1) of 10 Pa but the substrate is heated at a temperature which is not higher than 650° C. so that the thin film of oxide superconductor 2a deposited becomes an a-axis oriented thin film.

Figure 4F:
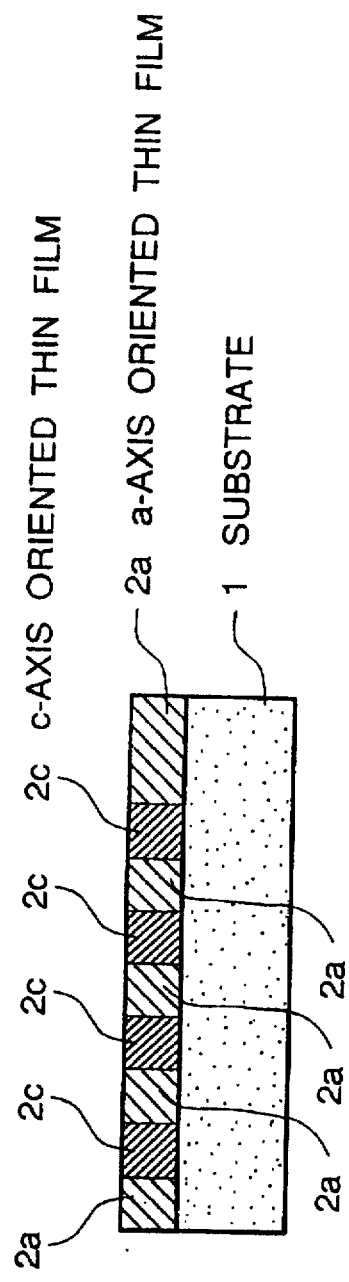

After then, a surface of the a-axis oriented thin film 2a is smoothed by a dry etching technique such as reactive ion etching or argon milling to obtain a superconducting circuit according to the present invention as is shown in FIG. 4F in which both of the superconducting lines 2c made of c-axis oriented thin film and the superconducting lines 2a made of a-axis oriented thin film make a planar surface on a common plane or on the surface of the substrate 1.

In practice, an insulator layer may be deposited on a surface of the resulting superconducting circuit of FIG. 3 before the circuit is passed to next stage for completing the superconducting circuit into a desired superconducting device.

The insulation zones 23 shown in FIG. 3 can be prepared by deoxygenation of the thin film 2 of oxide superconductor. Namely, after predetermined areas of the thin film 2 of oxide superconductor are protected with photoresist or insulator, remaining exposed areas are subjected to a treatment of deoxygenation so that the exposed areas are changed into non-superconductor.

We claim:

1. A process for fabricating a superconducting circuit having superconducting wiring lines each made of a thin film of oxide superconductor deposited on a substrate, said process comprising the steps of:

depositing a first thin film of an oxide superconductor such that one of the a-axis and the c-axis of said first thin film is oriented perpendicularly to a surface of said substrate, removing predetermined areas of said first thin film to leave a first pattern of superconducting wiring lines, depositing a second thin film of a same oxide superconductor as said first thin film such that said second thin film becomes one of a c-axis oriented thin film and an a-axis oriented thin film and said second thin film has a orientation different from said first thin film on said surface of said substrate, and removing an upper part of said second thin film so as to expose said first pattern of superconducting wiring lines.

2. The process set forth in claim 1, wherein said first thin film of oxide superconductor is a c-axis oriented thin film and said second thin film of oxide superconductor is an a-axis oriented thin film.

3. The process set forth in claim 1, further comprising the step of forming insulation zones adjacent to said superconducting wiring lines.

4. The process set forth in claim 3 wherein said insulation zones are produced by deoxygenation treatment.

* * * * *